(12) United States Patent
Gupta et al.

(10) Patent No.: US 9,166,595 B2
(45) Date of Patent: Oct. 20, 2015

(54) CONFIGURABLE FLIP-FLOP CIRCUIT

(71) Applicants: Gaurav Gupta, Noida (IN); Shiva Belwal, Noida (IN); Ashish Goel, Noida (IN)

(72) Inventors: Gaurav Gupta, Noida (IN); Shiva Belwal, Noida (IN); Ashish Goel, Noida (IN)

(73) Assignee: FREESCALE SEMICONDUCTOR, INC, Austin, TX (US)

( * ) Notice: Subject to any disclaimer, the term of this patent is extended or adjusted under 35 U.S.C. 154(b) by 24 days.

(21) Appl. No.: 14/141,469

(22) Filed: Dec. 27, 2013

(65) Prior Publication Data

US 2015/0188545 A1     Jul. 2, 2015

(51) Int. Cl.
*H03K 3/356* (2006.01)
*H03K 19/173* (2006.01)
*H03K 3/037* (2006.01)

(52) U.S. Cl.
CPC ............ *H03K 19/1733* (2013.01); *H03K 3/037* (2013.01); *H03K 3/35606* (2013.01); *H03K 3/356026* (2013.01); *H03K 3/356078* (2013.01); *H03K 19/1736* (2013.01)

(58) Field of Classification Search
CPC ............................ H05B 37/02; H03K 19/1733
USPC ......................................................... 315/291
See application file for complete search history.

(56) References Cited

U.S. PATENT DOCUMENTS

| 6,791,355 B2 | 9/2004 | Vergnes |
| 7,137,094 B2 | 11/2006 | Tien |
| 8,378,728 B1 * | 2/2013 | Goyal et al. ................. 327/203 |

* cited by examiner

*Primary Examiner* — Sibin Chen
*Assistant Examiner* — Metasebia Retebo
(74) *Attorney, Agent, or Firm* — Charles E. Bergere

(57) ABSTRACT

A configurable flip-flop circuit has modifiable connections between its circuit elements that allow it to be modified for primary and secondary uses. For example, the flip-flop circuit can be modified to provide secondary functions of NOR and NAND gates during an implementation of an ECO. At other times, the flip-flop circuit can be used to deliver normal flip-flop functionality. A configurable latch circuit is provided that can be modified to provide an output signal or an inverted output signal. A scan circuit is provided that can provide the functionality of a multiplexer.

16 Claims, 5 Drawing Sheets

CONFIGURABLE FLIP-FLOP CIRCUIT

BACKGROUND OF THE INVENTION

The present invention relates generally to digital circuits, and more particularly, to a configurable flip-flop circuit.

The complexity of integrated circuit (IC) design has continually increased over the years. As a result, using computer software to design an IC has become a necessity. Computer aided design (CAD) tools are used to create an IC blueprint, referred to as a layout, which illustrates a logic level design of the IC. To design the layout, a circuit design is simplified into various logic cells and then these logic cells are appropriately combined to generate a circuit that performs the function of the circuit design. A place-and-route CAD program is then used to optimize the circuit design. The place-and-route program re-arranges the logic cells and the corresponding interconnections to define the most suitable routing scheme and channels to connect the logic cells and other circuit elements. The place-and-route program has a library of predefined logic cell types (e.g., NOT, NAND, NOR, XOR, multiplexer, flip-flop, and other combinational logic circuits) to implement the circuit design.

Design is followed by fabrication, where the blueprint (layout) is used to create basic complementary metal-oxide-semiconductor (CMOS) transistor layers, contact and metal layers in silicon using a combination of semiconductor processes including depositing, masking, etching and so on. The CMOS transistor layers, and the contact and metal layers define the elements and interconnections of the IC and are combined to form a functional IC.

Certain modifications may be needed in the original layout to either delete or add logic elements and interconnections during the fabrication stage. To expedite the modification process, engineering change orders (ECOs) are generated to document the desired modifications. Thereafter, the layout is modified using the place-and-route CAD tool to incorporate the desired changes.

Conventional IC design protocols often provide additional spare logic cells of different types in the layout. These spare logic cells are used to implement the ECOs. However, due to limitations of the IC design software environment, only a predetermined number and types of spare logic cells are included in the layout, which limits the modifications that may be performed to implement the ECOs. Thus, desired functions may have to be removed or the layout process re-initiated with the desired logic cells. However, re-designing the IC and generating a new layout is very costly and time consuming.

Further, even if a desired spare logic cell is available in the layout, the position of the spare logic cell may not be suitable to meet routing and timing closure requirements. The IC designer is required to painstakingly identify alternate routing paths to circumvent the position constraints of the spare logic cells, thereby leading to higher turnaround time for incorporating the ECO.

Therefore, it would be advantageous to have a solution that provides a high degree of flexibility for implementing ECOs, and simplifies routing and timing closure requirements.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
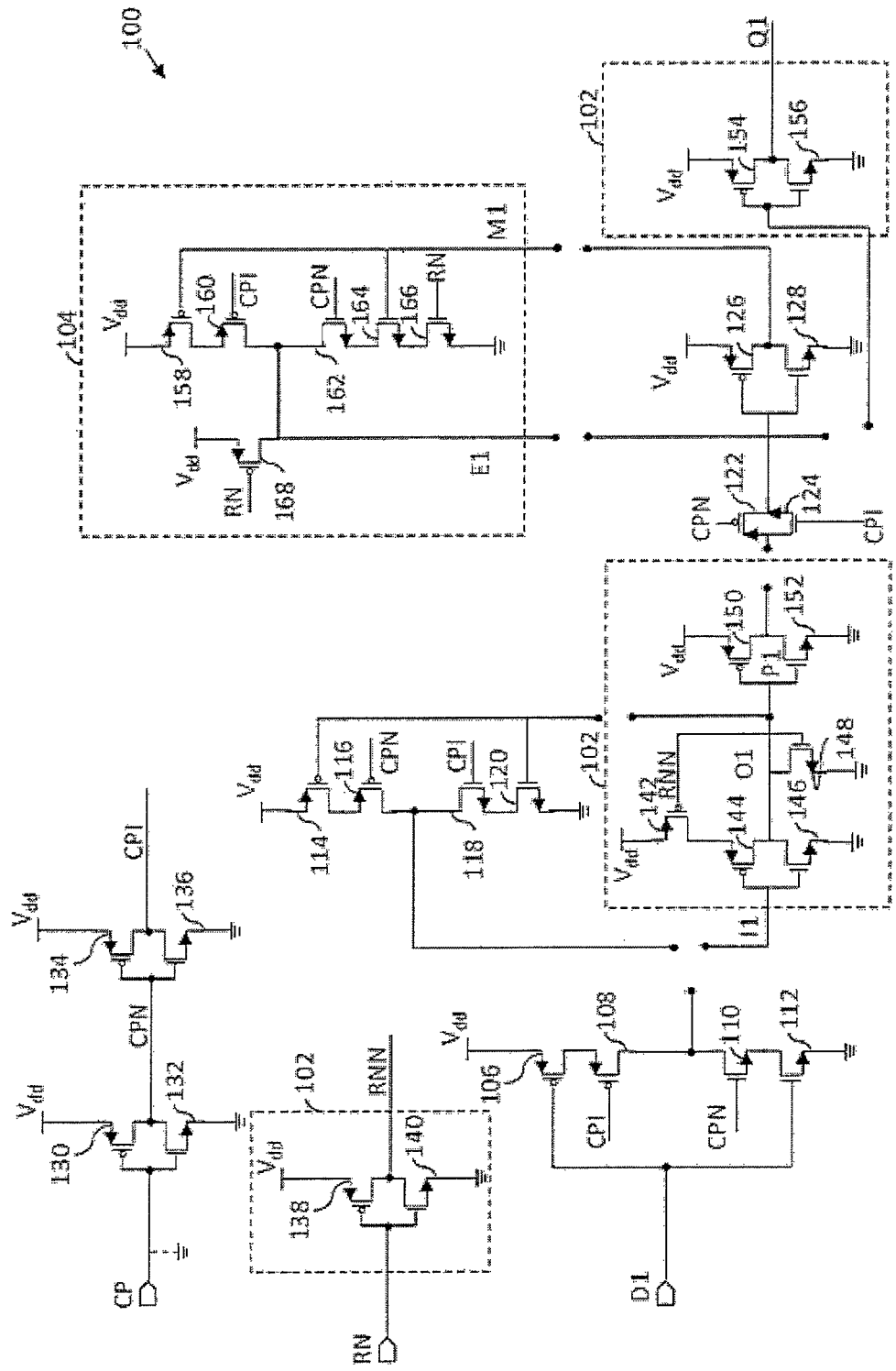
FIG. 1 is a schematic circuit diagram of a flip-flop circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a flip-flop circuit for generating an output signal based on an input signal and a clock signal is provided. The flip-flop circuit includes: a first transistor having a source terminal for receiving a supply voltage, and a gate terminal for receiving the input signal; a second transistor having a source terminal connected to a drain terminal of the first transistor, and a gate terminal for receiving the clock signal; a third transistor having a drain terminal connected to a drain terminal of the second transistor, and a gate terminal for receiving an inverted clock signal; a fourth transistor having a drain terminal connected to a source terminal of the third transistor, a gate terminal connected to the gate terminal of the first transistor, and a source terminal shorted to ground; a fifth transistor having a source terminal for receiving the supply voltage; a sixth transistor having a source terminal connected to a drain terminal of the fifth transistor, and a gate terminal for receiving the inverted clock signal; a seventh transistor having a drain terminal connected to a drain terminal of the sixth transistor, and a gate terminal for receiving the clock signal; an eighth transistor having a drain terminal connected to a source terminal of the seventh transistor, a source terminal shorted to ground, and a gate terminal connected to a gate terminal of the fifth transistor; a NOR2A gate for receiving a first intermediate input signal and a reset signal, and generating the output signal.

The NOR2A gate includes: a ninth transistor having a source terminal for receiving the supply voltage, and a gate terminal for receiving an inverted reset signal; a tenth transistor having a source terminal connected to a drain terminal of the ninth transistor, and a gate terminal for receiving the first intermediate input signal; an eleventh transistor having a drain terminal connected to a drain terminal of the tenth transistor, a gate terminal connected to the gate terminal of the tenth transistor, and a source terminal shorted to ground. The first intermediate output signal is generated at the drain terminals of the tenth and eleventh transistors. The NOR2A gate further includes: a twelfth transistor having a drain terminal connected to the drain terminals of the tenth and eleventh transistors, a gate terminal connected to the gate terminal of the ninth transistor, and source terminal shorted to ground; a thirteenth transistor having a source terminal for receiving the supply voltage, and a gate terminal connected to the drain terminals of the tenth and eleventh transistors; a fourteenth transistor having a drain terminal connected to a drain terminal of the thirteenth transistor, a gate terminal connected to the gate terminal of the thirteenth transistor, and a source terminal shorted to ground.

The flip-flop circuit further includes: a fifteenth transistor having a gate terminal for receiving the inverted clock signal; a sixteenth transistor having a gate terminal for receiving the clock signal, a drain terminal connected to a source terminal of the fifteenth transistor, and a source terminal connected to a drain terminal of the fifteenth transistor; a seventeenth transistor having a source terminal for receiving the supply voltage, and a gate terminal connected to the drain terminal and source terminals of the fifteenth and sixteenth transistors, respectively; and an eighteenth transistor having a drain terminal connected to a drain terminal of the seventeenth transistor, a gate terminal connected to the gate terminal of the seventeenth transistor, and a source terminal shorted to ground. A second intermediate input signal is generated at the drain terminals of the seventeenth and eighteenth transistors. The flip-flop circuit further includes a NAND gate for receiving the second intermediate input signal and the reset signal as a third intermediate input signal and generating a second intermediate output signal.

The NAND gate includes: a nineteenth transistor having a source terminal for receiving the supply voltage; a twentieth transistor having a source terminal connected to a drain terminal of the nineteenth transistor, and a gate terminal for receiving the clock signal; a twenty-first transistor having a drain terminal connected to a drain terminal of the twentieth transistor, and a gate terminal for receiving the inverted clock signal; a twenty-second transistor having a drain terminal connected to a drain terminal of the twenty-first transistor, and a gate terminal connected to a gate terminal of the nineteenth transistor; and a twenty-third transistor having a drain terminal connected to a source terminal of the twenty-second transistor, a source terminal shorted to ground, and a gate terminal for receiving the reset signal; and a twenty-fourth transistor having a source terminal for receiving the supply voltage, a gate terminal for receiving the reset signal, and a drain terminal connected to the drain terminals of the twentieth and twenty-first transistors. The second intermediate output signal is generated at the drain terminal of the twenty-fourth transistor.

In another embodiment of the present invention, a flip-flop circuit for generating an output signal based on an input signal and a clock signal is provided. The flip-flop circuit includes: a first transistor having a source terminal for receiving a supply voltage, and a gate terminal for receiving the input signal; a second transistor having a source terminal connected to a drain terminal of the first transistor, and a gate terminal for receiving the clock signal; a third transistor having a drain terminal connected to a drain terminal of the second transistor, and a gate terminal for receiving an inverted clock signal; a fourth transistor having a drain terminal connected to a source terminal of the third transistor, a gate terminal connected to the gate terminal of the first transistor, and a source terminal shorted to ground; a fifth transistor having a source terminal for receiving the supply voltage; a sixth transistor having a source terminal connected to a drain terminal of the fifth transistor, and a gate terminal for receiving an inverted clock signal; a seventh transistor having a drain terminal connected to a drain terminal of the sixth transistor, and a gate terminal for receiving the clock signal; an eighth transistor having a drain terminal connected to a source terminal of the seventh transistor, a source terminal shorted to ground, and a gate terminal connected to a gate terminal of the fifth transistor; and a NAND gate for receiving a first intermediate input signal and generating the output signal.

The NAND gate includes: a ninth transistor having a source terminal for receiving the supply voltage, and a gate terminal for receiving the first intermediate input signal; a tenth transistor having a source terminal connected to a drain terminal of the ninth transistor, and a gate terminal for connected to the gate terminal of the ninth transistor; an eleventh transistor having a drain terminal connected to a source terminal of the tenth transistor, a gate terminal for receiving a set signal, and a source terminal shorted to ground; a twelfth transistor having a source terminal for receiving the supply voltage, a drain terminal connected to the drain terminals of the tenth and eleventh transistors, and a gate terminal for receiving the set signal; a thirteenth transistor having a source terminal for receiving the supply voltage, and a gate terminal connected to the drain terminals of the ninth and tenth transistors; and a fourteenth transistor having a drain terminal connected to a drain terminal of the thirteenth transistor, a gate terminal connected to the gate terminal of the thirteenth transistor, and a source terminal shorted to ground.

The flip-flop circuit further includes: a fifteenth transistor having a gate terminal for receiving the inverted clock signal; a sixteenth transistor having a gate terminal for receiving the clock signal, a drain terminal connected to a source terminal of the fifteenth transistor, and a source terminal connected to a drain terminal of the fifteenth transistor; a seventeenth transistor having a source terminal for receiving the supply voltage, and a gate terminal connected to the drain terminal and source terminals of the fifteenth and sixteenth transistors, respectively; and an eighteenth transistor having a drain terminal connected to a drain terminal of the seventeenth transistor, a gate terminal connected to the gate terminal of the seventeenth transistor, and a source terminal shorted to ground. A second intermediate input signal is generated at the drain terminals of the seventeenth and eighteenth transistors. The flip-flop further circuit includes a NOR2A gate for receiving the second intermediate input signal and the set signal as a third intermediate input signal, and generating a second intermediate output signal.

The NOR2A gate includes: a nineteenth transistor having a source terminal for receiving the supply voltage, and a gate terminal for receiving an inverted set signal; a twentieth transistor having a source terminal connected to a drain terminal of the nineteenth transistor, and a gate terminal for receiving the inverted clock signal; a twenty-first transistor having a drain terminal connected to a drain terminal of the twentieth transistor, and a gate terminal for receiving the clock signal; a twenty-second transistor having a drain terminal connected to a source terminal of the twenty-first transistor, and a gate terminal for receiving the inverted clock signal; and a twenty-third transistor having a drain terminal connected to a source terminal of the twenty-second transistor, a source terminal shorted to ground, and a gate terminal connected to the gate terminal of the twentieth transistor; and a twenty-fourth transistor having a drain terminal connected to the source and drain terminals of the twenty-first and twenty-second transistors, respectively, a gate terminal for receiving the inverted set signal, and a source terminal shorted to ground. The second intermediate output signal is generated at the drain terminal of the twenty-fourth transistor.

In yet another embodiment of the present invention, a latch circuit for generating an output signal based on an input signal and a clock signal is provided. The latch circuit includes: a first transistor having a source terminal for receiving a supply voltage, and a gate terminal for receiving the input signal; a second transistor having a source terminal connected to a drain terminal of the first transistor, and a gate terminal for receiving the clock signal; a third transistor having a drain terminal connected to a drain terminal of the second transistor, and a gate terminal for receiving an inverted clock signal. A first intermediate input signal is generated at the drain terminals of the second and third transistors.

The latch circuit further includes: a fourth transistor having a drain terminal connected to a source terminal of the third transistor, a gate terminal connected to the gate terminal of the first transistor, and a source terminal shorted to ground; a fifth transistor having a source terminal for receiving the supply voltage; a sixth transistor having a source terminal connected to a drain terminal of the fifth transistor, and a gate terminal for receiving the inverted clock signal; a seventh transistor having a drain terminal connected to a drain terminal of the sixth transistor, and a gate terminal for receiving the clock signal; an eighth transistor having a drain terminal connected to a source terminal of the seventh transistor, a source terminal shorted to ground, and a gate terminal connected to a gate terminal of the fifth transistor; a ninth transistor having a source terminal for receiving the supply voltage, and a gate terminal for receiving the first intermediate input signal; a tenth transistor having a drain terminal connected to a drain terminal of the ninth transistor, a gate terminal connected to the gate terminal of the tenth transistor, and a source terminal shorted to ground. The gate terminals of the fifth and eighth transistors are connected to the drain terminals of the ninth and tenth transistors. The gate terminals of the ninth and tenth transistors are connected to the drain terminals of the second, third, sixth and seventh transistors, and a first intermediate output signal is generated at the drain terminals of the ninth and tenth transistors.

The latch circuit further includes: an eleventh transistor having a source terminal for receiving the supply voltage; a twelfth transistor having a source terminal connected to a drain terminal of the eleventh transistor, and a gate terminal for receiving the clock signal; a thirteenth transistor having a drain terminal connected to a drain terminal of the twelfth transistor, and a gate terminal for receiving the inverted clock signal; a fourteenth transistor having a drain terminal connected to a source terminal of the thirteenth transistor, a gate terminal connected to a gate terminal of the eleventh transistor, and a source terminal shorted to ground; a fifteenth transistor having a source terminal for receiving the supply voltage; a sixteenth transistor having a drain terminal connected to a drain terminal of the fifteenth transistor, a gate terminal connected to a gate terminal of the fifteenth transistor, and a source terminal shorted to ground; a seventeenth transistor having a gate terminal for receiving the inverted clock signal; an eighteenth transistor having a gate terminal for receiving the clock signal, a drain terminal connected to a source terminal of the seventeenth transistor, and a source terminal connected to a drain terminal of the seventeenth transistor. The source and drain terminals of the seventeenth and eighteenth transistors, respectively, are connected to the drain terminals of the fifteenth and sixteenth transistors. The latch circuit further includes: a nineteenth transistor having a source terminal for receiving the supply voltage, and a gate terminal connected to the drain and source terminals of the seventeenth and eighteenth transistors, respectively; a twentieth transistor having a drain terminal connected to a drain terminal of the nineteenth transistor, a gate terminal connected to the gate terminal of the nineteenth transistor, and a source terminal shorted to ground. The drain terminals of the nineteenth and twentieth transistors are connected to the gate terminals of the eleventh and fourteenth transistors. The latch circuit further includes: a twenty-first transistor having a source terminal for receiving the supply voltage, and a gate terminal connected to the drain terminals of the ninth and tenth transistors; and a twenty-second transistor having a drain terminal connected to a drain terminal of the twenty-first transistor, a gate terminal connected to the gate terminal of the twenty-first transistor, and a source terminal shorted to ground. The output signal is generated at the drain terminals of the twenty-first and twenty-second transistors.

Various embodiments of the present invention provide configurable flip-flop, latch, and scan circuits. The connections between a predetermined set of circuit elements of each of these circuits may be modified to ensure a primary and a secondary usage (while implementing an engineering change order, ECO) of the above circuits. For example, the flip-flop circuit can be modified to provide secondary functionalities of NOR2A and NAND gates during the implementation of an ECO that may require either of these logical functions. The flip-flop circuit may at other times be used to deliver normal flip-flop functionality. The flip-flop circuit can be modified based on the ECO requirement to provide an output signal or an inverted version of the output signal. The scan circuit can be used to provide the functionality of a multiplexer.

The above-mentioned dual uses are achieved by placing connections between various terminals of predetermined sets of transistors in a metal layer that is at a higher level compared to that of the remaining transistors of the flip-flop. Such a placement of the connections in a metal layer that is at a higher level than the remaining metal layers enables the usage of the spare circuits in an ECO that requires the functions of the NOR2A gate, NAND gate, multiplexer, and the like. The availability of the logic gate functionalities during ECOs considerably increases the possibility of accommodating greater number of ECOs when a change request is generated during critical stages of IC fabrication, thereby saving time and resources required for a complete re-spin of the IC design. The savings achieved on time and resources translate in to quicker time-to-market of the product and reduced manufacturing costs of the product. Further, the availability of the logical functions close to an implemented logic reduces routing congestion in the IC, thereby reducing routing delays and enabling quicker timing closures.

Referring now to FIG. 1, a schematic circuit diagram of a flip-flop circuit 100 in accordance with an embodiment of the present invention is shown. The flip-flop circuit 100 includes a first NOR2A gate 102, a first NAND gate 104, and first through sixteenth transistors 106-136. The first NOR2A gate 102 includes seventeenth through twenty-sixth transistors 138-156, and the first NAND gate 104 includes twenty-seventh through thirty-second transistors 158-168. As is known by those of skill in the art, a NOR2A gate is a 2 input NOR gate having a low active A-input.

The first transistor 106 has a source terminal connected to a voltage supply $V_{dd}$, a drain terminal connected to a source terminal of the second transistor 108, and a gate terminal provided with a first input signal (D1). The second transistor 108 has a gate terminal that is provided with a clock signal (CPI), and a drain terminal connected to a drain terminal of the third transistor 110. The third transistor 110 has a gate terminal that is provided with an inverted clock signal (CPN), and a source terminal connected to a drain terminal of the fourth transistor 112. The fourth transistor 112 has a gate terminal that is connected to the gate terminal of the first transistor 106 for receiving the first input signal D1, and a source terminal shorted or connected to ground.

The fifth transistor 114 has a source terminal connected to the voltage supply $V_{dd}$, and a drain terminal connected to a source terminal of the sixth transistor 116. The sixth transistor 116 has a gate terminal that is provided with the inverted clock signal CPN, and a drain terminal connected to a drain terminal of the seventh transistor 118. A gate terminal of the seventh transistor 118 is provided with the clock signal CPI, and a source terminal thereof is connected to a drain terminal of the eighth transistor 120. A gate terminal of the eighth transistor 120 is connected to a gate terminal of the fifth transistor 114, and a source terminal of the eighth transistor 120 is shorted to ground.

The ninth transistor 122 has a source terminal connected to a drain terminal of the tenth transistor 124, a drain terminal connected to a source terminal of the tenth transistor 124, and a gate terminal provided with the inverted clock signal CPN. The tenth transistor 124 has a gate terminal that is provided with the clock signal CPI.

The eleventh transistor 126 has a source terminal that is connected to the voltage supply $V_{dd}$, a gate terminal connected to the drain and source terminals of the ninth and tenth transistors, respectively, and a drain terminal connected to a drain terminal of the twelfth transistor 128. A gate terminal of the twelfth transistor 128 is connected to the gate terminal of the eleventh transistor 126, and a source terminal of the twelfth transistor 128 is shorted to ground. A source terminal of the thirteenth transistor 130 is connected to the voltage supply $V_{dd}$, a gate terminal thereof is provided with the clock signal CP, and a drain terminal of the thirteenth transistor 130 is connected to a drain terminal of the fourteenth transistor 132. The inverted clock signal CPN is generated at the drain terminals of the thirteenth and fourteenth transistors 130 and 132. A gate terminal of the fourteenth transistor 132 is connected to the gate terminal of the thirteenth transistor 130, and a source terminal of the fourteenth transistor 132 is shorted to ground.

A source terminal of the fifteenth transistor 134 is connected to the voltage supply $V_{dd}$, a gate terminal thereof is connected to the drain terminals of the thirteenth and fourteenth transistors 130 and 132 for receiving the inverted clock signal CPN, and a drain terminal of the fifteenth transistor 134 is connected to a drain terminal of the sixteenth transistor 136. The clock signal CPI is generated at the drain terminals of the fifteenth and sixteenth transistors 134 and 136. Further, a gate terminal of the sixteenth transistor 136 is connected to the gate terminal of the fifteenth transistor 134, and a source terminal of the sixteenth transistor 136 is shorted to ground.

A source terminal of the seventeenth transistor 138 is connected to the voltage supply $V_{dd}$, a gate terminal thereof is provided with a reset signal (RN), and a drain terminal of the seventeenth transistor 138 is connected to a drain terminal of the eighteenth transistor 140. An inverted reset signal (RNN) is generated at the drain terminals of the seventeenth and eighteenth transistors 138 and 140. A gate terminal of the eighteenth transistor 140 is connected to the gate terminal of the seventeenth transistor 138, and a source terminal of the eighteenth transistor 140 is shorted to ground.

A source terminal of the nineteenth transistor 142 is connected to the voltage supply $V_{dd}$, a drain terminal thereof is connected to a source terminal of the twentieth transistor 144, and a gate terminal of the nineteenth transistor 142 is provided with the inverted reset signal RNN. A gate terminal of the twentieth transistor 144 is provided with a first intermediate input signal (I1), and a drain terminal of the twentieth transistor 144 is connected to a drain terminal of the twenty-first transistor 146. A first intermediate output signal (O1) is generated at the drain terminals of the twentieth and twenty-first transistors 144 and 146. A gate terminal of the twenty-first transistor 146 is connected to the gate terminal of the twentieth transistor 144, and a source terminal of the twenty-first transistor 146 is shorted to ground. A drain terminal of the twenty-second transistor 148 is connected to the drain terminals of the twentieth and twenty-first transistors 144 and 146, a gate terminal of the twenty-second transistor 148 is connected to the gate terminal of the nineteenth transistor 142, and a source terminal of the twenty-second transistor 148 is shorted to ground.

A source terminal of the twenty-third transistor 150 is connected to the voltage supply $V_{dd}$, a gate terminal thereof is connected to the drain terminals of the twentieth and twenty-first transistors 144 and 146 for receiving the first intermediate output signal O1, and a drain terminal of the twenty-third transistor 150 is connected to a drain terminal of the twenty-fourth transistor 152. A gate terminal of the twenty-fourth transistor 152 is connected to the gate terminal of the twenty-third transistor 150, and a source terminal of the twenty-fourth transistor 152 is shorted to ground.

A source terminal of the twenty-fifth transistor 154 is connected to the voltage supply $V_{dd}$, a gate terminal thereof is connected to the drain terminals of the twenty-third and twenty-fourth transistors 150 and 152, and a drain terminal of the twenty-fifth transistor 154 is connected to a drain terminal of the twenty-sixth transistor 156. A first output signal (Q1) is generated at the drain terminals of the twenty-fifth and twenty-sixth transistors 154 and 156. A gate terminal of the twenty-sixth transistor 156 is connected to the gate terminal of the twenty-fifth transistor 154, and a source terminal of the twenty-sixth transistor 156 is shorted to ground.

A source terminal of the twenty-seventh transistor 158 is connected to the voltage supply $V_{dd}$, and a drain terminal thereof is connected to a source terminal of the twenty-eighth transistor 160. A gate terminal of the twenty-eighth transistor 160 is provided with the clock signal CPI, and a drain terminal of the twenty-eighth transistor 160 is connected to a drain terminal of the twenty-ninth transistor 162. A gate terminal of the twenty-ninth transistor 162 is provided with the inverted clock signal CPN, and a source terminal of the twenty-ninth transistor 162 is connected to a drain terminal of the thirtieth transistor 164. A gate terminal of the thirtieth transistor 164 is connected to a gate terminal of the twenty-seventh transistor 158, and a source terminal of the thirtieth transistor 164 is connected to a drain terminal of the thirty-first transistor 166. A gate terminal of the thirty-first transistor 166 is provided with the reset signal RN, and a source terminal thereof is shorted to ground. A source terminal of the thirty-second transistor 168 is connected to the voltage supply $V_{dd}$, a gate terminal thereof is provided with the reset signal RN, and a drain terminal thereof is connected to the drain terminals of the twenty-eighth and twenty-ninth transistors 160 and 162.

The flip-flop circuit 100 provides the functionality of a NOR2A gate by way of a first set of circuit elements referred to as the first NOR2A gate 102 and the functionality of a NAND gate by way of a second set of circuit elements referred to as the first NAND gate 104. The NOR2A gate functionality is provided with the first intermediate signal I1 and the reset signal RN as input signals of the NOR2A gate and the first output signal Q1 as an output signal of the NOR2A gate. The connection between the drain terminals of the twenty-third and twenty-fourth transistors 150 and 152 and the gate terminals of the twenty-fifth and twenty-sixth transistors 154 and 156 is at a higher metal layer as compared to the metal layers of the remaining connections. The placement of the above mentioned connection at the higher metal layer enables the usage of the first NOR2A gate 102 in conjunction with the remaining circuit elements (of the flip-flop circuit 100) for enabling normal flip-flop functionality and also for enabling the NOR2A gate functionality. Thus, the first NOR2A gate 102 may be used to implement an ECO that requires the NOR2A gate functionality. Likewise, the first NAND gate 104 can be used to provide NAND gate functionality by using the reset signal RN and a second intermediate input signal (M1) as input signals of the NAND gate and a second intermediate output signal (E1) as an output signal of the NAND gate. Thus, the NAND gate 104 may be used for implementing an ECO that requires the NAND gate functionality. Additionally, the NAND gate 104 may be used in conjunction with the remaining circuit elements (of the flip-flop circuit 100) for enabling normal flip-flop functionality.

In an embodiment of the preset invention, the clock signal CP is shorted to ground for enabling proper functioning of the first NAND gate 104 as a NAND gate while implementing an ECO. Further, the flip-flop circuit 100 is a positive-edge triggered D-type flip-flop with active low asynchronous reset. The first, second, fifth, sixth, ninth, eleventh, thirteenth, fifteenth, seventeenth, nineteenth, twentieth, twenty-third, twenty-fifth, twenty-seventh, twenty-eighth, and thirty-second transistors are n-channel metal-oxide semiconductor (NMOS) transistors. Further, the third, fourth, seventh, eighth, tenth, twelfth, fourteenth, sixteenth, eighteenth, twenty-first, twenty-second, twenty-fourth, twenty-sixth, twenty-ninth, thirtieth, and thirty-first transistors are p-channel metal-oxide semiconductor (PMOS) transistors.

Figure 2:
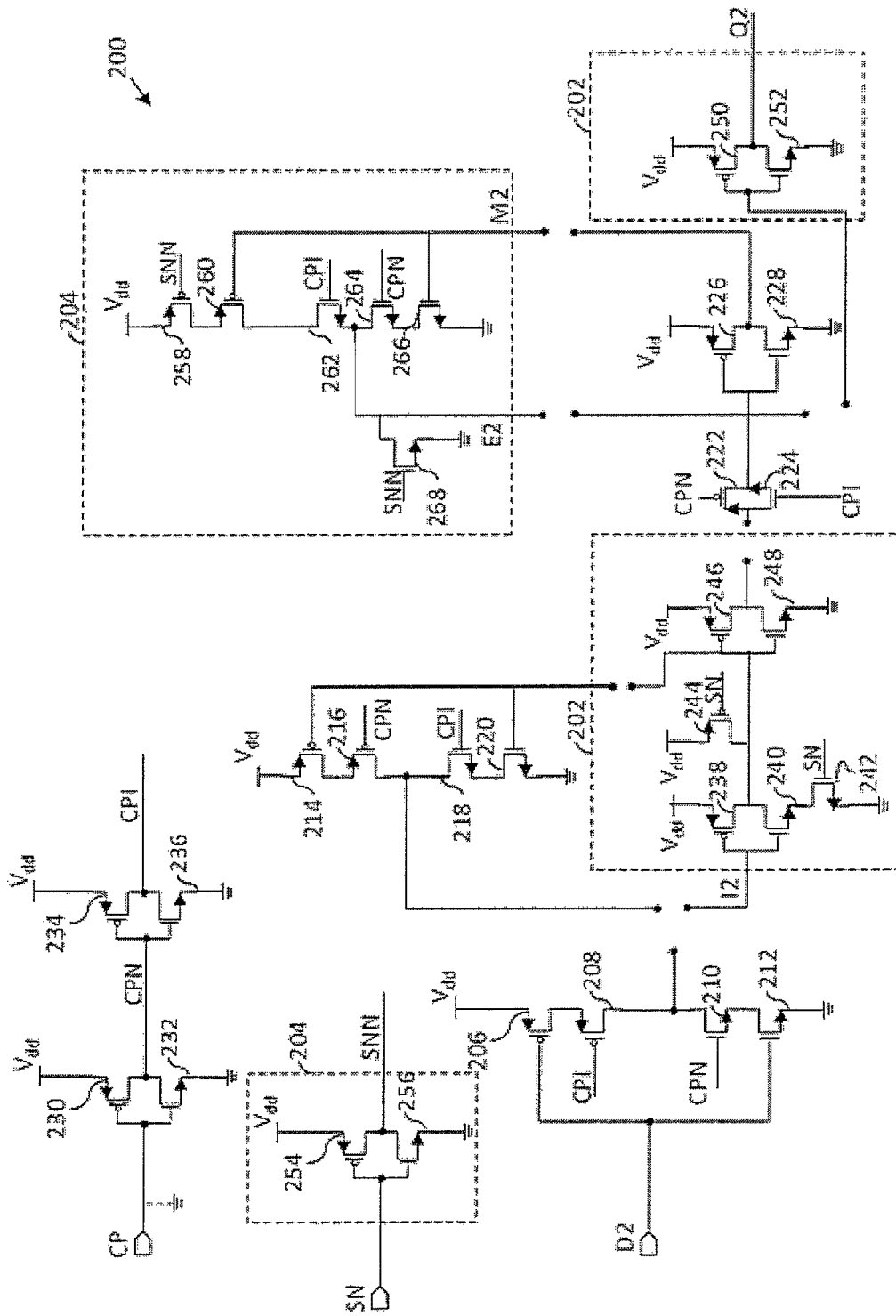
FIG. 2 is a schematic circuit diagram of a flip-flop circuit in accordance with another embodiment of the present invention.

Referring now to FIG. 2, a schematic circuit diagram of a flip-flop circuit 200 in accordance with an embodiment of the present invention is shown. The flip-flop circuit 200 includes a second NAND gate 202, a second NOR2A gate 204, and thirty-third through forty-eighth transistors 206-236. The second NAND gate 202 includes forty-ninth through fifty-sixth transistors 238-252, and the second NOR2A gate 204 includes fifty-seventh through sixty-fourth transistors 254-268.

A source terminal of the thirty-third transistor 206 is connected to a voltage supply $V_{dd}$, a drain terminal thereof is connected to a source terminal of the thirty-fourth transistor 208, and a gate terminal of the thirty-third transistor 206 is provided with a second input signal (D2). A gate terminal of the thirty-fourth transistor 208 is provided with a clock signal CPI, and a drain terminal thereof is connected to a drain terminal of the thirty-fifth transistor 210. A gate terminal of the thirty-fifth transistor 210 is provided with an inverted clock signal CPN, and a source terminal thereof is connected to a drain terminal of the thirty-sixth transistor 212. A gate terminal of the thirty-sixth transistor 212 is connected to the gate terminal of the thirty-third transistor 206 for receiving the second input signal D2, and a source terminal of the thirty-sixth transistor 212 is shorted to ground.

A source terminal of the thirty-seventh transistor 214 is connected to the voltage supply $V_{dd}$, and a drain terminal thereof is connected to a source terminal of the thirty-eighth transistor 216. A gate terminal of the thirty-eighth transistor 216 is provided with the inverted clock signal CPN, and a drain terminal thereof is connected to a drain terminal of the thirty-ninth transistor 218. A gate terminal of the thirty-ninth transistor 218 is provided with the clock signal CPI, and a source terminal thereof is connected to a drain terminal of the fortieth transistor 220. A gate terminal of the fortieth transistor 220 is connected to a gate terminal of the thirty-seventh transistor 214, and a source terminal of the fortieth transistor 220 is shorted to ground.

A source terminal of the forty-first transistor 222 is connected to a drain terminal of the forty-second transistor 224, a drain terminal of the forty-first transistor 222 is connected to a source terminal of the forty-second transistor 224, and a gate terminal of the forty-first transistor 222 is provided with the inverted clock signal CPN. A gate terminal of the forty-second transistor 224 is provided with the clock signal CPI.

A source terminal of the forty-third transistor 226 is connected to the voltage supply $V_{dd}$, a gate terminal thereof is connected to the drain and source terminals of the forty-first and forty-second transistors 222 and 224, respectively, and a drain terminal of the forty-third transistor 226 is connected to a drain terminal of the forty-fourth transistor 228. A gate terminal of the forty-fourth transistor 228 is connected to the gate terminal of the forty-third transistor 126, and a source terminal of the forty-fourth transistor 228 is shorted to ground.

A source terminal of the forty-fifth transistor 230 is connected to the voltage supply $V_{dd}$, a gate terminal thereof is provided with the clock signal CP, and a drain terminal of the forty-fifth transistor 230 is connected to a drain terminal of the forty-sixth transistor 232. The inverted clock signal CPN is generated at the drain terminals of the forty-fifth and forty-sixth transistors 230 and 232. A gate terminal of the forty-sixth transistor 232 is connected to the gate terminal of the forty-fifth transistor 230, and a source terminal of the forty-sixth transistor 232 is shorted to ground. A source terminal of the forty-sixth transistor 134 is connected to the voltage supply $V_{dd}$, a gate terminal thereof is connected to the drain terminals of the forty-fifth and forty-sixth transistors 230 and 232 for receiving the inverted clock signal CPN, and a drain terminal of the forty-seventh transistor 234 is connected to a drain terminal of the forty-eighth transistor 236. The clock signal is generated at the drain terminals of the forty-seventh and forty-eighth transistors 234 and 236. A gate terminal of the forty-eighth transistor 236 is connected to the gate terminal of the forty-seventh transistor 234, and a source terminal of the forty-eighth transistor 236 is shorted to ground.

A source terminal of the forty-ninth transistor 238 is connected to the voltage supply $V_{dd}$, a drain terminal thereof is connected to a drain terminal of the fiftieth transistor 240, and a gate terminal of the forty-ninth transistor 238 is provided with a third intermediate input signal (I2). A gate terminal of the fiftieth transistor 240 is connected to the gate terminal of the forty-ninth transistor 238, and a source terminal of the fiftieth transistor 240 is connected to a drain terminal of the fifty-first transistor 242. A gate terminal of the fifty-first transistor 242 is provided with a set signal (SN) and a source terminal thereof is shorted to ground.

A source terminal of the fifty-second transistor is connected to the voltage supply $V_{dd}$, a gate terminal thereof is provided with the set signal SN, and a drain terminal thereof is connected to the drain terminals of the forty-ninth and fiftieth transistors 238 and 240.

A source terminal of the fifty-third transistor 246 is connected to the voltage supply $V_{dd}$, a gate terminal thereof is connected to the drain terminals of the forty-ninth and fiftieth transistors 238 and 240, and a drain terminal of the fifty-third transistor 246 is connected to a drain terminal of the fifty-fourth transistor 248. Further, a gate terminal of the fifty-fourth transistor 248 is connected to the gate terminal of the fifty-third transistor 246, and a source terminal of the fifty-fourth transistor 248 is shorted to ground.

A source terminal of the fifty-fifth transistor 250 is connected to the voltage supply $V_{dd}$, a gate terminal thereof is connected to the drain terminals of the fifty-third and fifty-fourth transistors 246 and 248, and a drain terminal of the fifty-fifth transistor 250 is connected to a drain terminal of the fifty-sixth transistor 252. A second output signal (Q2) is generated at the drain terminals of the fifty-fifth and fifty-sixth transistors 252 and 254. Further, a gate terminal of the fifty-sixth transistor 252 is connected to the gate terminal of the fifty-fifth transistor 250, and a source terminal of the fifty-sixth transistor 252 is shorted to ground.

A source terminal of the fifty-seventh transistor 254 is connected to the voltage supply $V_{dd}$, a gate terminal thereof is provided with the set signal, and a drain terminal of the fifty-seventh transistor 254 is connected to a drain terminal of the fifty-eighth transistor 256. An inverted set signal (SNN) is generated at the drain terminals of the fifty-seventh and fifty-eighth transistors 254 and 256. Further, a gate terminal of the fifty-eighth transistor 256 is connected to the gate terminal of the fifty-seventh transistor 254, and a source terminal of the fifty-eighth transistor 256 is shorted to ground.

A source terminal of the fifty-ninth transistor 258 is connected to the voltage supply $V_{dd}$, a drain terminal thereof is connected to a source terminal of the sixtieth transistor 260, and a gate terminal of the fifty-ninth transistor 258 is provided with the inverted set signal SNN. A drain terminal of the sixtieth transistor 260 is connected to a drain terminal of the sixty-first transistor 262. A gate terminal of the sixty-first transistor 262 is provided with the clock signal CPI, and a source terminal of the sixty-first transistor 262 is connected to a drain terminal of the sixty-second transistor 264. A gate terminal of the sixty-second transistor 264 is provided with the inverted clock signal CPN, and a source terminal of the sixty-second 264 is connected to a drain terminal of the sixty-third transistor 266. A gate terminal of the sixty-third transistor 266 is connected to a gate terminal of the sixtieth transistor 260, and a source terminal thereof is shorted to ground. A source terminal of the sixty-fourth transistor 268 is connected to the voltage supply $V_{dd}$, a gate terminal thereof is provided with the inverted set signal SNN, and a drain terminal thereof is connected to the source and drain terminals of the sixty-first and sixty-second transistors 262 and 264.

The flip-flop circuit 200 provides the functionality of a NAND gate through a third set of circuit elements referred to as the second NAND gate 202 and of a NOR2A gate through a fourth set of circuit elements referred to as the second NOR2A gate 204. The NAND gate functionality is provided for using the third intermediate input signal I2 and the set signal SN as input signals of the NAND gate and the second output signal Q2 as an output signal of the NAND gate. The connection between the drain terminals of the fifty-third and fifty-fourth transistors 246 and 248 and the gate terminals of the fifty-fifth and fifty-sixth transistors 250 and 252 is at a higher metal layer as compared to the metal layers of the remaining connections. The placement of the above mentioned connection at a higher metal layer enables the usage of the second NAND gate 202 in conjunction with the remaining circuit elements (of the flip-flop circuit 200) for enabling normal flip-flop functionality and also for enabling the NAND gate functionality. Thus, the second NAND gate 202 may be used to implement an ECO that requires the NAND gate functionality. Likewise, the second NOR2A gate 204 provides a NOR2A gate functionality using the set signal SN and a fourth intermediate input signal (M2) as input signals of the NOR2A gate and a third intermediate output signal (E2) as an output signal of the NOR2A gate. Thus, the second NOR2A gate 204 may be used for implementing an ECO that requires the NOR2A gate functionality. Additionally, the second NOR2A gate 204 may be used in conjunction with the remaining circuit elements (of the flip-flop circuit 200) for enabling normal flip-flop functionality.

In an embodiment of the preset invention, the clock signal CP is shorted to ground for proper functioning of the second NAND gate 202 while implementing an ECO requiring the NAND gate functionality. Further, the flip-flop circuit 200 is a positive-edge triggered D-type flip-flop with active low asynchronous set. The thirty-third, thirty-fourth, thirty-seventh, thirty-eighth, forty-first, forty-third, forty-fifth, forty-seventh, forty-ninth, fifty-second, fifty-third, fifty-fifth, fifty-seventh, fifty-ninth, and sixtieth are n-channel metal-oxide semiconductor (NMOS) transistors. Further, the thirty-fifth, thirty-sixth, thirty-ninth, fortieth, forty-second, forty-fourth, forty-sixth, forty-eighth, fiftieth, fifty-first, fifty-fourth, fifty-sixth, fifty-eighth, sixty-first, sixty-second, sixty-third, and sixty-fourth transistors are p-channel metal-oxide semiconductor (PMOS) transistors.

Figure 3A:
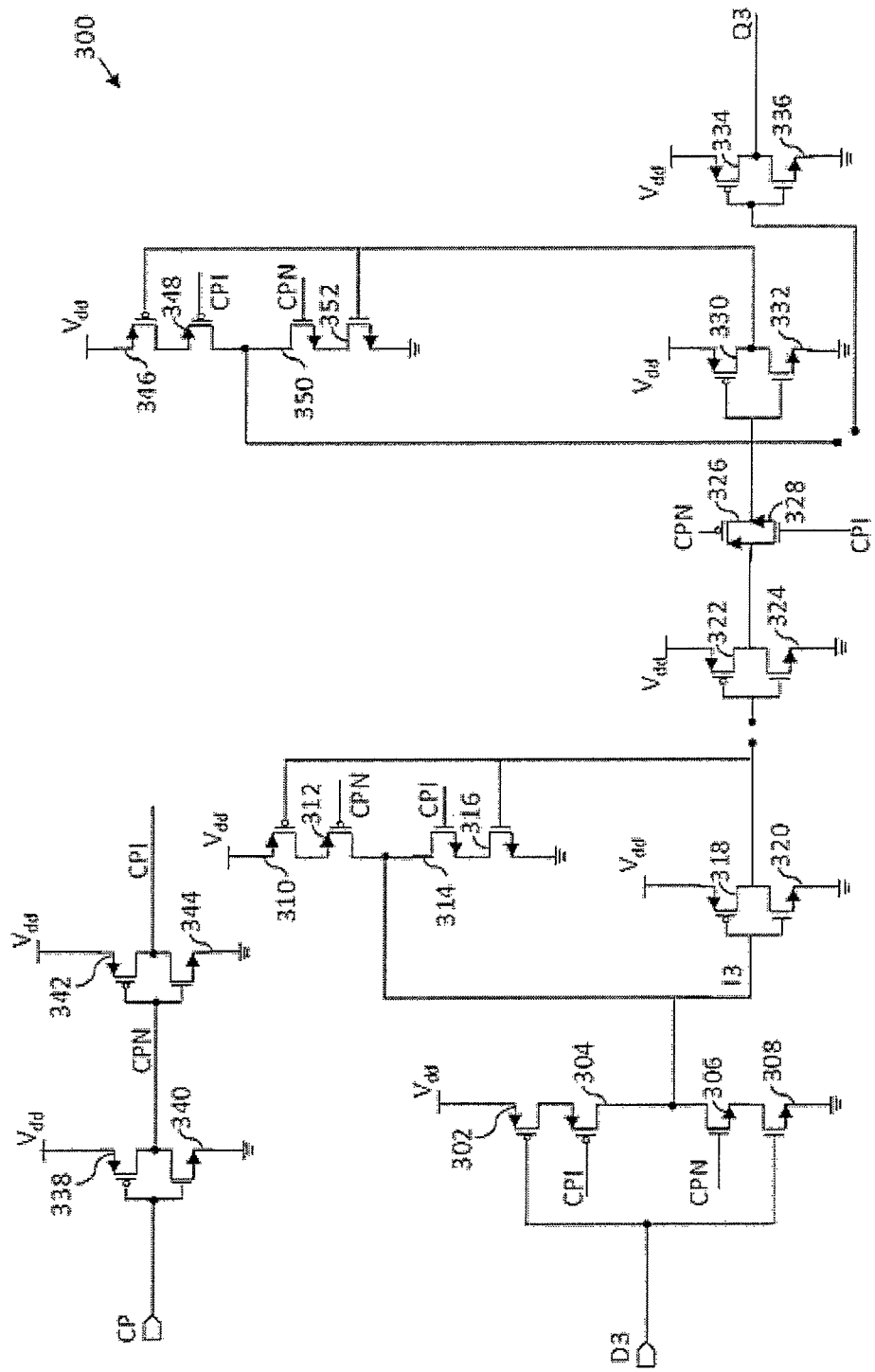
FIGS. 3A and 3B are schematic circuit diagrams of a latch circuit in accordance with an embodiment of the present invention.

Referring now to FIG. 3A, a schematic circuit diagram of a latch circuit 300 in accordance with an embodiment of the present invention is shown. The latch circuit 300 includes sixty-fifth through ninetieth transistors 302-352.

A source terminal of the sixty-fifth transistor 302 is connected to a voltage supply $V_{dd}$, a drain terminal thereof is connected to a source terminal of the sixty-sixth transistor 304, and a gate terminal of the sixty-fifth transistor 302 is provided with a third input signal (D3). A gate terminal of the sixty-sixth transistor 304 is provided with a clock signal CPI, and a drain terminal thereof is connected to a drain terminal of the sixty-seventh transistor 306. A fifth intermediate input signal (I3) is generated at the drain terminals of the sixty-sixth and sixty-seventh transistors 304 and 306. A gate terminal of the sixty-seventh transistor 306 is provided with an inverted clock signal CPN, and a source terminal thereof is connected to a drain terminal of the sixty-eighth transistor 308. A gate terminal of the sixty-eighth transistor 308 is connected to the gate terminal of the sixty-fifth transistor 302 for receiving the third input signal D3, and a source terminal of the sixty-eighth transistor 308 is shorted to ground.

A source terminal of the sixty-ninth transistor 310 is connected to the voltage supply $V_{dd}$, and a drain terminal thereof is connected to a source terminal of the seventieth transistor 312. A gate terminal of the seventieth transistor 312 is provided with the inverted clock signal CPN, and a drain terminal thereof is connected to a drain terminal of the seventy-first transistor 314. A gate terminal of the seventy-first transistor 314 is provided with the clock signal CPI, and a source terminal thereof is connected to a drain terminal of the seventy-second transistor 316. A gate terminal of the seventy-second transistor 316 is connected to a gate terminal of the sixty-ninth transistor 310, and a source terminal of the seventy-second transistor 316 is shorted to ground.

A source terminal of the seventy-third transistor 318 is connected to the voltage supply $V_{dd}$, a gate terminal thereof is connected to the drain terminals of the sixty-sixth and sixty-seventh transistors 304 and 306 for receiving the fifth intermediate input signal I3, and a drain terminal of the seventy-third transistor 318 is connected to a drain terminal of the seventy-fourth transistor 320. Further, a gate terminal of the seventy-fourth transistor 320 is connected to the gate terminal of the seventy-third transistor 318, and a source terminal of the seventy-fourth transistor 320 is shorted to ground.

A source terminal of the seventy-fifth transistor 322 is connected to the voltage supply $V_{dd}$, a gate terminal thereof is connected to a gate terminal of the seventy-sixth transistor 324, and a drain terminal of the seventy-fifth transistor 322 is connected to a drain terminal of the seventy-sixth transistor 324. A source terminal of the seventy-sixth transistor 324 is shorted to ground.

A source terminal of the seventy-seventh transistor 326 is connected to a drain terminal of the seventy-eighth transistor 328, a drain terminal of the seventy-seventh transistor 326 is connected to a source terminal of the seventy-eighth transistor 328, and a gate terminal of the seventy-seventh transistor 326 is provided with the inverted clock signal CPN. A gate terminal of the seventy-eighth transistor 328 is provided with the clock signal CPI.

A source terminal of the seventy-ninth transistor 330 is connected to the voltage supply $V_{dd}$, a gate terminal thereof is connected to the drain and source terminals of the seventy-seventh and seventy-eighth transistors 326 and 328, recepectively, and a drain terminal of the seventy-ninth transistor 330 is connected to a drain terminal of the eightieth transistor 332. A gate terminal of the eightieth transistor 332 is connected to a gate terminal of the seventy-ninth transistor 330, and a source terminal of the eightieth transistor 332 is shorted to ground.

A source terminal of the eighty-first transistor 334 is connected to the voltage supply $V_{dd}$, a gate terminal thereof is connected to the drain terminals of the seventy-third and seventy-fourth transistors 318 and 320, and a drain terminal of the eighty-first transistor 334 is connected to a drain terminal of the eighty-second transistor 336. A third output signal (Q3) is generated at the drain terminals of the eighty-first and eighty-second transistors 334 and 336. Further, a gate terminal of the eighty-second transistor 336 is connected to the gate terminal of the eighty-first transistor 334, and a source terminal of the eighty-second transistor 336 is shorted to ground.

A source terminal of the eighty-third transistor 338 is connected to the voltage supply $V_{dd}$, a gate terminal thereof is provided with the clock signal CP, and a drain terminal of the eighty-third transistor 338 is connected to a drain terminal of the eighty-fourth transistor 340. The inverted clock signal CPN is generated at the drain terminals of the eighty-third and eighty-fourth transistors 338 and 340. A gate terminal of the eighty-fourth transistor 340 is connected to the gate terminal of the eighty-third transistor 338, and a source terminal of the eighty-fourth transistor 340 is shorted to ground.

A source terminal of the eighty-fifth transistor 342 is connected to the voltage supply $V_{dd}$, a gate terminal thereof is connected to the drain terminals of the eighty-third and eighty-fourth transistors 338 and 340 for receiving the inverted clock signal CPN, and a drain terminal of the eighty-fifth transistor 342 is connected to a drain terminal of the eighty-sixth transistor 344. The clock signal CPI is generated at the drain terminals of the eighty-fifth and eighty-sixth transistors 342 and 344. Further, a gate terminal of the eighty-sixth transistor 344 is connected to the gate terminal of the eighty-fifth transistor 342, and a source terminal of the eighty-sixth transistor 344 is shorted to ground.

A source terminal of the eighty-seventh transistor 346 is connected to the voltage supply $V_{dd}$, and a drain terminal thereof is connected to a source terminal of the eighty-eighth transistor 348. A drain terminal of the eighty-eighth transistor 348 is connected to a drain terminal of the eighty-ninth transistor 350, and a gate terminal of the eighty-eighth transistor 348 is provided with the clock signal CPI. A gate terminal of the eighty-ninth transistor 350 is provided with the inverted clock signal CPN, and a source terminal of the eighty-ninth transistor 350 is connected to a drain terminal of the ninetieth transistor 352. A gate terminal of the ninetieth transistor 352 is connected to a gate terminal of the eighty-sixth transistor 346, and a source terminal of the ninetieth transistor 352 is shorted to ground.

Figure 3B:
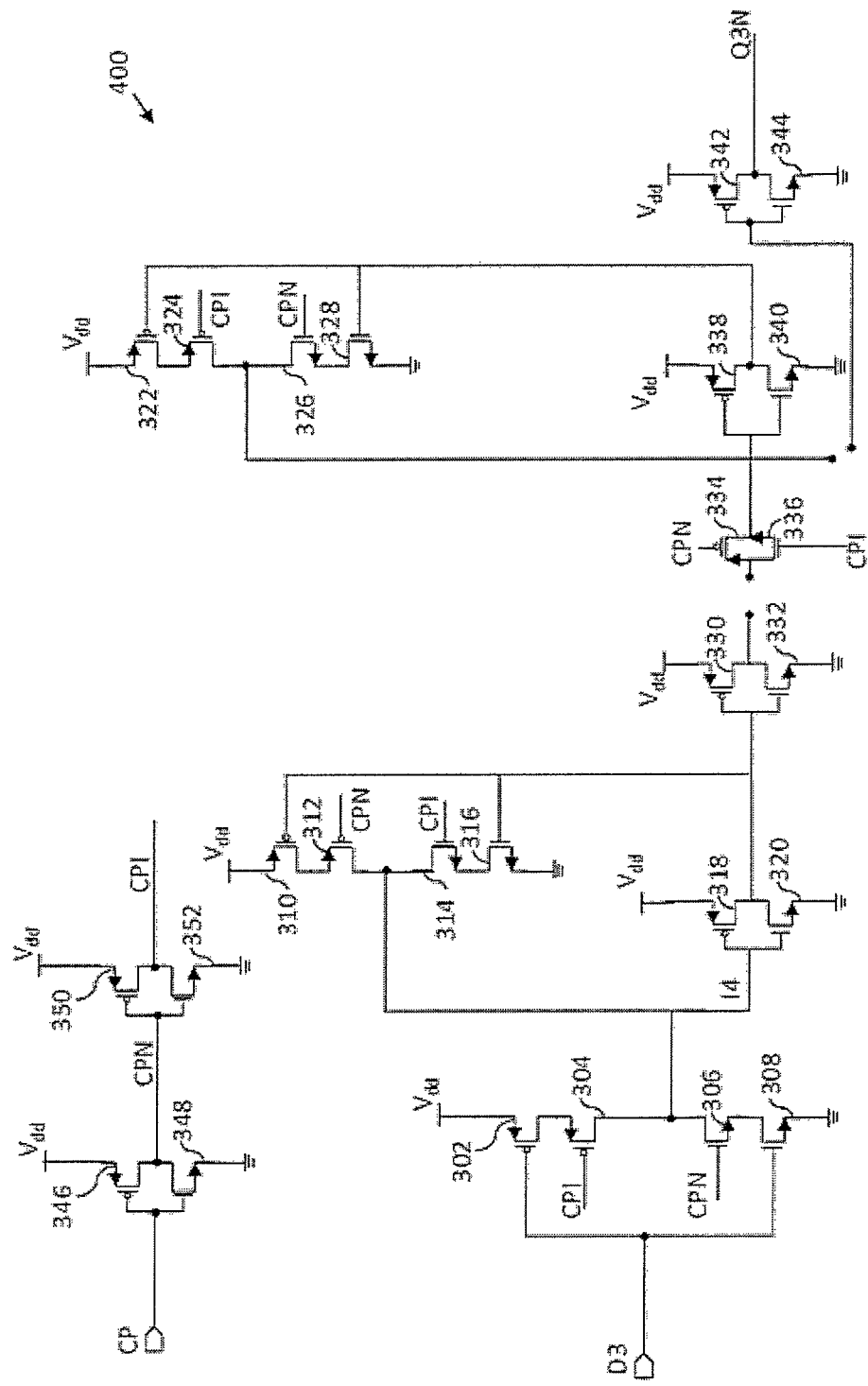

Referring now to FIG. 3B, a schematic circuit diagram of a latch circuit 400 in accordance with an embodiment of the present invention is shown. The latch circuit 400 is shown to include circuit elements shown to be a part of the latch circuit 300. The connections between the circuit elements of the latch circuit 400 are identical to the connections between the circuit elements of the latch circuit 300 except that in the latch circuit 400 the drain terminals of the eighty-fifth and eighty-sixth transistors 342 and 344 are connected to the drain terminals of the seventy-ninth and eightieth transistors 330 and 332. Due to the above difference in connections, the latch circuit 400 generates an inverted third output signal (Q3N) at the drain terminals of the eighty-first and eighty-second transistors 334 and 336.

The connection between the drain terminals of the eighty-first and eighty-second transistors 334 and 336 and the drain terminals of the seventy-third and seventy-fourth transistors 318 and 320 (refer FIG. 3A) and the connection between the drain terminals of the eighty-fifth and eighty-sixth transistors 342 and 344 and the drain terminals of the seventy-ninth and eightieth transistors 330 and 332 (refer FIG. 3B) are at a higher metal layer as compared to the metal layers of the remaining connections. The placement of the above mentioned connection at a higher metal layer enables the usage of same latch circuit to either generate the third output signal Q3 or the inverted third output signal Q3N based on the requirement of an ECO.

In an embodiment of the present invention, the latch circuits 300 and 400 are negative gate D-type latches in which the latch circuit 400 is modified to generate an inverted version (the inverted third output signal Q3N) of the output signal (the third output signal Q3) that the latch circuit 300 generates.

Figure 4:
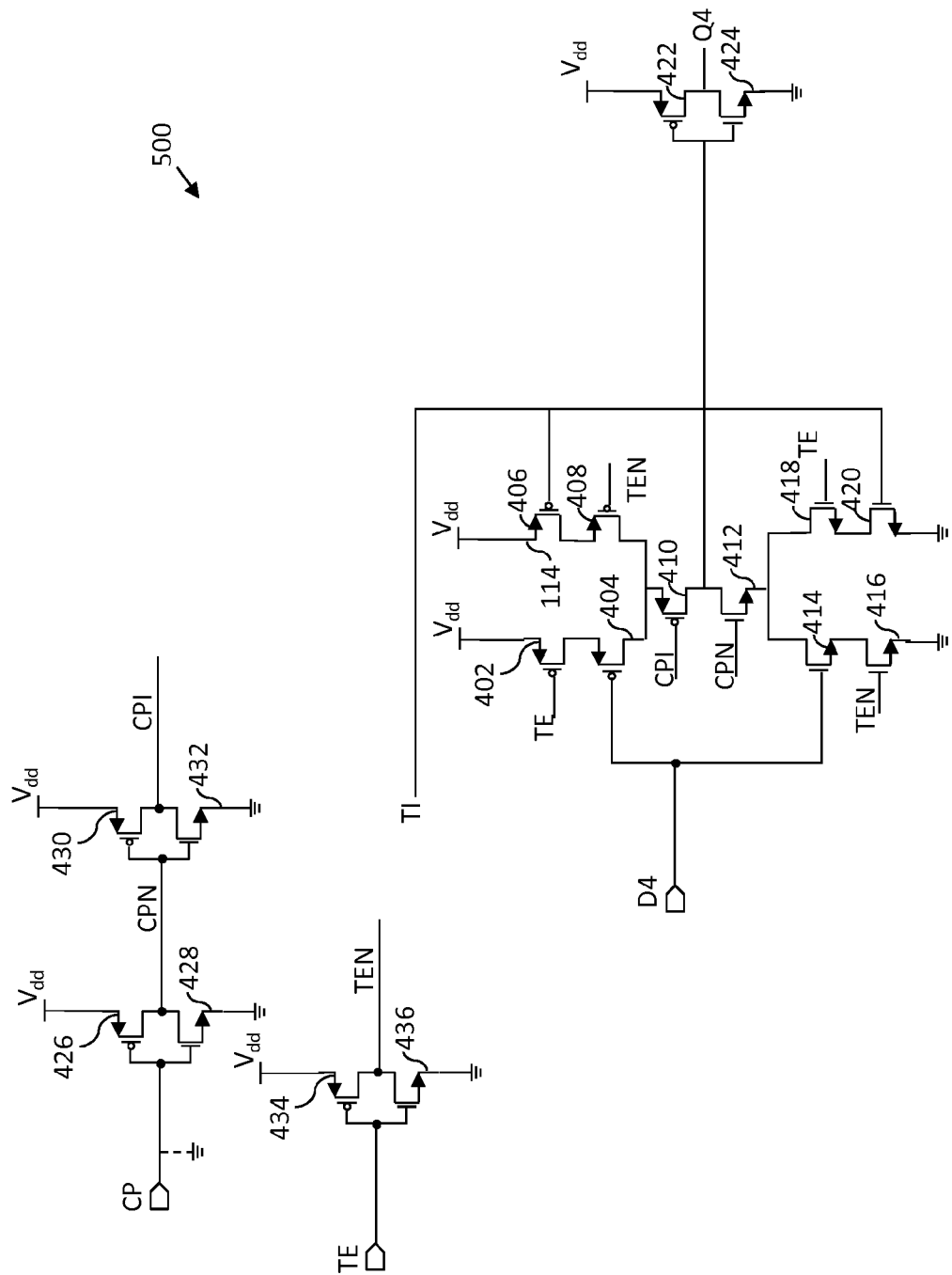
FIG. 4 is a schematic circuit diagram of a scan circuit in accordance with an embodiment of the present invention.

Referring now to FIG. 4, a schematic circuit diagram of a scan circuit 500 in accordance with an embodiment of the present invention is shown. The scan circuit 500 includes ninety-first through one-hundred-eighth transistors 402-436.

A source terminal of the ninety-first transistor 402 is connected to the voltage supply $V_{dd}$, a drain terminal thereof is connected to a source terminal of the ninety-second transistor 404, and a gate terminal of the ninety-first transistor 402 is provided with a test enable signal (TE). A gate terminal of the ninety-second transistor 404 is provided with a fourth input signal (D4). A source terminal of the ninety-third transistor 406 is connected to the voltage supply $V_{dd}$, a drain terminal thereof is connected to a source terminal of the ninety-fourth transistor 408, and a gate terminal of the ninety-third transistor 406 is provided with a test input signal (TI). A gate terminal of the ninety-fourth transistor 408 is provided with an inverted test enable signal (TEN), and a drain terminal of the ninety-fourth transistor 408 is connected to a drain terminal of the ninety-second transistor 404. A source terminal of the ninety-fifth transistor 410 is connected to the drain terminals of the ninety-second and ninety-fourth transistors 404 and 408, a drain terminal of the ninety-fifth transistor 410 is connected to a drain terminal of the ninety-sixth transistor 412, and a gate terminal of the ninety-fifth transistor 410 is provided with a clock signal CPI. A gate terminal of the ninety-sixth transistor 412 is provided with an inverted clock signal CPN, and a source terminal of the ninety-sixth transistor 412 is connected to a drain terminal of the ninety-seventh transistor 414.

A gate terminal of the ninety-seventh transistor 414 is connected to the gate terminal of the ninety-second transistor 404 for receiving the fourth input signal D4, and a source terminal of the ninety-seventh transistor 414 is connected to a drain terminal of the ninety-eighth transistor 416. A gate terminal of the ninety-eighth transistor 416 is provided with the inverted test enable signal TEN, and a source terminal of the ninety-eighth transistor 416 is shorted to ground. A drain terminal of the ninety-ninth transistor 418 is connected to the source terminal of the ninety-sixth transistor 412, a gate terminal of the ninety-ninth transistor 418 is provided with the test enable signal TE, and a source terminal of the ninety-ninth transistor 418 is connected to a drain terminal of the one-hundredth transistor 420. A gate terminal of the one-hundredth transistor 420 is connected to the gate terminal of the ninety-third transistor for receiving the test input signal TI, and a source terminal of the one-hundredth transistor 420 is shorted to ground.

A source terminal of the one-hundred-first transistor 422 is connected to the voltage supply $V_{dd}$, a drain terminal thereof is connected to a drain terminal of the one-hundred-second transistor 424, and a gate terminal of the one-hundred-first transistor 422 is connected to the drain terminals of the ninety-fifth and ninety-sixth transistors 410 and 412. A fourth output signal (Q4) is generated at the drain terminals of the one-hundred-first and one-hundred-second transistors 422 and 424. A gate terminal of the one-hundred-second transistor 424 is connected to the gate terminal of the one-hundred-first transistor 422, and a source terminal of the one-hundred-second transistor 424 is shorted to ground.

A source terminal of the one-hundred-third transistor 426 is connected to the voltage supply $V_{dd}$, a gate terminal thereof is provided with the clock signal CP, and a drain terminal of the one-hundred-third transistor 426 is connected to a drain terminal of the one-hundred-fourth transistor 428. The inverted clock signal CPN is generated at the drain terminals of the one-hundred-third and one-hundred-fourth transistors 426 and 428. Further, a gate terminal of the one-hundred-fourth transistor 428 is connected to the gate terminal of the one-hundred-third transistor 426, and a source terminal of the one-hundred-fourth transistor 428 is shorted to ground. A source terminal of the one-hundred-fifth transistor 430 is connected to the voltage supply $V_{dd}$, a gate terminal thereof is connected to the drain terminals of the one-hundred-third and one-hundred-fourth transistors 426 and 428 for receiving the inverted clock signal CPN, and a drain terminal of the one-hundred-fifth transistor 430 is connected to a drain terminal of the one-hundred-sixth transistor 432. The clock signal CPI is generated at the drain terminals of the one-hundred-fifth and one-hundred-sixth transistors 430 and 432. Further, a gate terminal of the one-hundred-sixth transistor 432 is connected to the gate terminal of the one-hundred-fifth transistor 430, and a source terminal of the one-hundred-sixth transistor 432 is shorted to ground.

A source terminal of the one-hundred-seventh transistor 434 is connected to the voltage supply $V_{dd}$, a gate terminal thereof is provided with the test enable signal TE, and a drain terminal of the one-hundred-seventh transistor 434 is connected to a drain terminal of the one-hundred-eighth transistor 436. The inverted test enable signal TEN is generated at the drain terminals of the one-hundred-seventh and one-hundred-eighth transistors 434 and 436. Further, a gate terminal of the one-hundred-eighth transistor 436 is connected to the gate terminal of the one-hundred-seventh transistor 434, and a source terminal of the one-hundred-eighth transistor 436 is shorted to ground.

The scan circuit 500 can be used as a multiplexer by using the test input signal TI and the fourth input signal D4 as the input signals of the multiplexer and the test enable signal TE as a select signal for selecting either of the input signals and outputting as the fourth output signal Q4. Thus, the scan circuit 500 may be used to implement an ECO that requires a multiplexer. In an embodiment of the present invention, the operation of the scan circuit 500 as the multiplexer requires the clock signal CP to be shorted to ground.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A flip-flop circuit (100) for effecting an Engineering Change Orders (ECO), wherein the flip-flop circuit generates an output signal based on an input signal and a clock signal, comprising:
   a first transistor (106) having a source terminal for receiving a supply voltage, and a gate terminal for receiving the input signal;
   a second transistor (108) having a source terminal connected to a drain terminal of the first transistor, and a gate terminal for receiving the clock signal;
   a third transistor (110) having a drain terminal connected to a drain terminal of the second transistor, and a gate terminal for receiving an inverted version of the clock signal;
   a fourth transistor (112) having a drain terminal connected to a source terminal of the third transistor, a gate terminal connected to the gate terminal of the first transistor, and a source terminal connected to ground;
   a fifth transistor (114) having a source terminal for receiving the supply voltage;
   a sixth transistor (116) having a source terminal connected to a drain terminal of the fifth transistor, and a gate terminal for receiving the inverted version of the clock signal;
   a seventh transistor (118) having a drain terminal connected to a drain terminal of the sixth transistor, and a gate terminal for receiving the clock signal;
   an eighth transistor (120) having a drain terminal connected to a source terminal of the seventh transistor, a source terminal connected to ground, and a gate terminal connected to a gate terminal of the fifth transistor, wherein to implement the flip-flop circuit, the drain terminals of the second and third transistors are connected to the drain terminals of the sixth and seventh transistors;
   a NOR2A gate (102) for receiving a first intermediate input signal (I1) and a reset signal, and generating the output signal, comprising:
   a ninth transistor (142) having a source terminal for receiving the supply voltage, and a gate terminal for receiving an inverted version of the reset signal;
   a tenth transistor (144) having a source terminal connected to a drain terminal of the ninth transistor, and a gate terminal for receiving the first intermediate input signal (I1);
   an eleventh transistor (146) having a drain terminal connected to a drain terminal of the tenth transistor, a gate terminal connected to the gate terminal of the tenth transistor, and a source terminal shorted to ground, wherein a first intermediate output signal (O1) is generated at the drain terminals of the tenth and eleventh transistors, and wherein to implement the flip-flop circuit the gate terminals of the tenth and eleventh transistors are connected to the drain terminals of the second and third transistors;
   a twelfth transistor (148) having a drain terminal connected to the drain terminals of the tenth and eleventh transistors, a gate terminal connected to the gate terminal of the ninth transistor, and source terminal shorted to ground;
   a thirteenth transistor (150) having a source terminal for receiving the supply voltage, and a gate terminal connected to the drain terminals of the tenth and eleventh transistors; and a fourteenth transistor (152) having a drain terminal connected to a drain terminal of the thirteenth transistor, a gate terminal connected to the gate terminal of the thirteenth transistor, and a source terminal shorted to ground, wherein to implement the flip-flop circuit, the first intermediate output signal is applied to the gates of the fifth and eighth transistors;

a fifteenth transistor (122) having a gate terminal for receiving the inverted version of the clock signal;

a sixteenth transistor (124) having a gate terminal for receiving the clock signal, a drain terminal connected to a source terminal of the fifteenth transistor, and a source terminal connected to a drain terminal of the fifteenth transistor, wherein to implement the flip-flop circuit, the drain terminals of the thirteenth and fourteenth transistors are connected to the source terminal of the fifteenth transistor;

a seventeenth transistor (126) having a source terminal for receiving the supply voltage, and a gate terminal connected to the drain and source terminals of the fifteenth and sixteenth transistors, respectively; and an eighteenth transistor (128) having a drain terminal connected to a drain terminal of the seventeenth transistor, a gate terminal connected to the gate terminal of the seventeenth transistor, and a source terminal shorted to ground, wherein a second intermediate input signal is generated at the drain terminals of the seventeenth and eighteenth transistors; and a NAND gate (104) for receiving the second intermediate input signal (M1) and the reset signal as a third intermediate input signal and generating a second intermediate output signal (E1), comprising:

a nineteenth transistor (158) having a source terminal for receiving the supply voltage;

a twentieth transistor (160) having a source terminal connected to a drain terminal of the nineteenth transistor, and a gate terminal for receiving the clock signal;

a twenty-first transistor (162) having a drain terminal connected to a drain terminal of the twentieth transistor, and a gate terminal for receiving the inverted version of the clock signal;

a twenty-second transistor (164) having a drain terminal connected to a drain terminal of the twenty-first transistor, and a gate terminal connected to a gate terminal of the nineteenth transistor, wherein the second intermediate input signal (MI) is received at the gate terminals of the nineteenth and twenty-second transistors; and a twenty-third transistor (166) having a drain terminal connected to a source terminal of the twenty-second transistor, a source terminal shorted to ground, and a gate terminal for receiving the reset signal; and a twenty-fourth transistor (168) having a source terminal for receiving the supply voltage, a gate terminal for receiving the reset signal, and a drain terminal connected to the drain terminals of the twentieth and twenty-first transistors, wherein the second intermediate output signal (E1) is generated at the drain terminal of the twenty-fourth transistor.

2. The flip-flop circuit of claim 1, further comprising:
a twenty-fifth transistor (130) having a source terminal for receiving the supply voltage, and a gate terminal for receiving a clock source signal; and
a twenty-sixth transistor (132) having a drain terminal connected to a drain terminal of the twenty-fifth transistor, a gate terminal connected to the gate terminal of the twenty-fifth transistor, and a source terminal shorted to ground, wherein the inverted version of the clock signal is generated at the drain terminals of the twenty-fifth and twenty-sixth transistors.

3. The flip-flop circuit of claim 2, further comprising:
a twenty-seventh transistor (134) having a source terminal for receiving the supply voltage, and a gate terminal for receiving the inverted version of the clock signal; and
a twenty-eighth transistor (136) having a drain terminal connected to a drain terminal of the twenty-seventh transistor, a gate terminal connected to the gate terminal of the twenty-seventh transistor, and a source terminal shorted to ground, wherein the clock signal is generated at the drain terminals of the twenty-seventh and twenty-eighth transistors.

4. The flip-flop circuit of claim 3, wherein the NOR2A gate further includes:
a twenty-ninth transistor (138) having a source terminal for receiving the supply voltage, and a gate terminal for receiving the reset signal; and
a thirtieth transistor (140) having a drain terminal connected to a drain terminal of the twenty-ninth transistor, a gate terminal connected to the gate terminal of the twenty-ninth transistor, and a source terminal shorted to ground, wherein the inverted version of the reset signal is generated at the drain terminals of the twenty-ninth and thirtieth transistors.

5. The flip-flop circuit of claim 3, wherein the NOR2A gate further includes:
a thirty-first transistor (154) having a source terminal for receiving the supply voltage, and wherein to implement the flip-flop circuit a gate terminal of the thirty-first transistor is connected to the drain terminal of twenty-fourth transistor for receiving the second intermediate output signal and for implementing the NOR2A gate, the drain terminals of the thirteenth and fourteenth transistors are connected to the gate terminal of the thirty-first transistor instead of to the source and drain terminals, respectively, of the fifteenth and sixteenth transistors; and
a thirty-second transistor (156) having a drain terminal connected to a drain terminal of the thirty-first transistor, a gate terminal connected to the gate terminal of the thirty-first transistor, and a source terminal shorted to ground, wherein the output signal (Q1) is generated at the drain terminals of the thirty-first and thirty-second transistors.

6. The flip-flop circuit of claim 5, wherein the first, second, fifth, sixth, ninth, tenth, thirteenth, fifteenth, seventeenth, nineteenth, twentieth, twenty-fourth, twenty-fifth, twenty-seventh, twenty-ninth, and thirty-first transistors are n-channel metal-oxide semiconductor (NMOS) transistors.

7. The flip-flop circuit of claim 5, wherein the third, fourth, seventh, eighth, eleventh, twelfth, fourteenth, sixteenth, eighteenth, twenty-first, twenty-second, twenty-third, twenty-sixth, twenty-eighth, thirtieth, and thirty-second transistors are p-channel metal-oxide semiconductor (PMOS) transistors.

8. The flip-flop circuit of claim 5, wherein the flip-flop circuit is of a positive-edge triggered D-type flip-flop with active low asynchronous reset.

9. A flip-flop circuit for effecting an Engineering Change Orders (ECO), wherein the flip-flop circuit generates an output signal based on an input signal and a clock signal, comprising:
a first transistor (206) having a source terminal for receiving a supply voltage, and a gate terminal for receiving the input signal;

a second transistor (208) having a source terminal connected to a drain terminal of the first transistor, and a gate terminal for receiving the clock signal;

a third transistor (210) having a drain terminal connected to a drain terminal of the second transistor, and a gate terminal for receiving an inverted version of the clock signal;

a fourth transistor (212) having a drain terminal connected to a source terminal of the third transistor, a gate terminal connected to the gate terminal of the first transistor, and a source terminal shorted to ground;

a fifth transistor (214) having a source terminal for receiving the supply voltage;

a sixth transistor (216) having a source terminal connected to a drain terminal of the fifth transistor, and a gate terminal for receiving the inverted version of the clock signal;

a seventh transistor (218) having a drain terminal connected to a drain terminal of the sixth transistor, and a gate terminal for receiving the clock signal;

an eighth transistor (220) having a drain terminal connected to a source terminal of the seventh transistor, a source terminal shorted to ground, and a gate terminal connected to a gate terminal of the fifth transistor, wherein to implement the flip-flop circuit, the drain terminals of the sixth and seventh transistors are connected to the drain terminals of the second and third transistors;

a NAND gate for receiving a set signal (SN) and a first intermediate input signal (I2) and generating the output signal (Q2), comprising:

a ninth transistor (238) having a source terminal for receiving the supply voltage, and a gate terminal for receiving the first intermediate input signal;

a tenth transistor (240) having a source terminal connected to a drain terminal of the ninth transistor, and a gate terminal connected to the gate terminal of the ninth transistor;

an eleventh transistor (242) having a drain terminal connected to a source terminal of the tenth transistor, a gate terminal for receiving e the set signal, and a source terminal shorted to ground;

a twelfth transistor (244) having a source terminal for receiving the supply voltage, a drain terminal connected to the drain terminals of the tenth and eleventh transistors, and a gate terminal for receiving the set signal;

a thirteenth transistor (246) having a source terminal for receiving the supply voltage, and a gate terminal connected to the drain terminals of the ninth and tenth transistors; and a fourteenth transistor (248) having a drain terminal connected to a drain terminal of the thirteenth transistor, a gate terminal connected to the gate terminal of the thirteenth transistor, and a source terminal shorted to ground, wherein to implement the flip-flop circuit, the gate terminals of the fifth and eighth transistors are connected to the gate terminals of the thirteenth and fourteenth transistors, and the gate terminals of the ninth and tenth transistors are connected to the drain terminals of the second and third transistors;

a fifteenth transistor (222) having a gate terminal for receiving the inverted version of the clock signal;

a sixteenth transistor (224) having a gate terminal for receiving the clock signal, a drain terminal connected to a source terminal of the fifteenth transistor, and a source terminal connected to a drain terminal of the fifteenth transistor, wherein to implement the flip-flop circuit, the drain terminals of the thirteenth and fourteenth transistors are connected to the source terminal of the fifteenth transistor;

a seventeenth transistor (226) having a source terminal for receiving the supply voltage, and a gate terminal connected to the drain and source terminals of the fifteenth and sixteenth transistors, respectively; and an eighteenth transistor (228) having a drain terminal connected to a drain terminal of the seventeenth transistor, a gate terminal connected to the gate terminal of the seventeenth transistor, and a source terminal shorted to ground; and a NOR2A gate (204) for receiving the set signal and a second intermediate signal (M2), and generating a second intermediate output signal (E2), comprising:

a nineteenth transistor (258) having a source terminal for receiving the supply voltage, and a gate terminal for receiving an inverted version of the set signal;

a twentieth transistor (260) having a source terminal connected to a drain terminal of the nineteenth transistor;

a twenty-first transistor (262) having a drain terminal connected to a drain terminal of the twentieth transistor, and a gate terminal for receiving the clock signal;

a twenty-second transistor (264) having a drain terminal connected to a source terminal of the twenty-first transistor, and a gate terminal for receiving the inverted version of the clock signal; and a twenty-third transistor (266) having a drain terminal connected to a source terminal of the twenty-second transistor, a source terminal shorted to ground, and a gate terminal connected to the gate terminal of the twentieth transistor, and wherein to implement the NOR2A gate, the second intermediate input signal is applied to the gate terminals of the twenty and twenty-third transistors; and a twenty-fourth transistor (268) having a drain terminal connected to the source and drain terminals of the twenty-first and twenty-second transistors, respectively, a gate terminal for receiving the inverted version of the set signal, and a source terminal shorted to ground, wherein the second intermediate output signal (E2) is generated at the drain terminal of the twenty-fourth transistor.

10. The flip-flop circuit of claim 9, further comprising:
a twenty-fifth transistor (230) having a source terminal for receiving the supply voltage, and a gate terminal for receiving a clock source signal; and a twenty-sixth transistor (232) having a drain terminal connected to a drain terminal of the twenty-fifth transistor, a gate terminal connected to the gate terminal of the twenty-fifth transistor, and a source terminal shorted to ground, wherein the inverted version of the clock signal is generated at the drain terminals of the twenty-fifth and twenty-sixth transistors, wherein to implement the flip-flop circuit, the gate terminals of the twenty and twenty-third transistors are connected to the drain terminals of the seventeenth and eighteenth transistors.

11. The flip-flop circuit of claim 10, further comprising:
a twenty-seventh transistor (234) having a source terminal for receiving the supply voltage, and a gate terminal for receiving the inverted version of the clock signal from the drain terminals of the twenty-fifth and twenty-sixth transistors; and a twenty-eighth transistor (236) having a drain terminal connected to a drain terminal of the twenty-seventh transistor, a gate terminal connected to the gate terminal of the twenty-seventh transistor, and a source terminal shorted to ground, wherein the clock signal is generated at the drain terminals of the twenty-seventh and twenty-eighth transistors.

12. The flip-flop circuit of claim 11, wherein the NOR2A gate further includes:
   a twenty-ninth transistor (254) having a source terminal for receiving the supply voltage, and a gate terminal for receiving the set signal; and
   a thirtieth transistor (256) having a drain terminal connected to a drain terminal of the twenty-ninth transistor, a gate terminal connected to the gate terminal of the twenty-ninth transistor, and a source terminal shorted to ground, wherein the inverted version of the set signal is generated at the drain terminals of the twenty-ninth and thirtieth transistors.

13. The flip-flop circuit of claim 12, wherein the NAND gate further includes:
   a thirty-first transistor (250) having a source terminal for receiving the supply voltage; and
   a thirty-second transistor (252) having a drain terminal connected to a drain terminal of the thirty-first transistor, a gate terminal connected to a gate terminal of the thirty-first transistor, and a source terminal shorted to ground, wherein to implement the flip-flop circuit, the gate terminals of the thirty-first and thirty-second transistors are connected to the drain terminal of the twenty-fourth transistor, and wherein the output signal is generated at the drain terminals of the thirty-first and thirty-second transistors, and wherein to implement the NAND gate, the gate terminals of the thirty-first and thirty-second transistors are connected to the drain terminals of the thirteenth and fourteenth transistors instead of to the source terminal of the twenty-fourth transistor, and instead of to the source and drain terminals of the fifteenth and sixteenth transistors, respectively.

14. The flip-flop circuit of claim 13, wherein the first, second, fifth, sixth, ninth, twelfth, thirteenth, fifteenth, seventeenth, nineteenth, twentieth, twenty-fifth, twenty-seventh, twenty-ninth, and thirty-first transistors are n-channel metal-oxide semiconductor (NMOS) transistors.

15. The flip-flop circuit of claim 14, wherein the third, fourth, seventh, eighth, tenth, eleventh, fourteenth, sixteenth, eighteenth, twenty-first, twenty-second, twenty-third, twenty-fourth, twenty-sixth, twenty-eighth, thirtieth, and thirty-second transistors are p-channel metal-oxide semiconductor (PMOS) transistors.

16. The flip-flop circuit of claim 13, wherein the flip-flop circuit is of a positive-edge triggered D-type flip-flop with active low asynchronous set.

* * * * *